United States Patent
Zhao et al.

(10) Patent No.: US 12,199,075 B2
(45) Date of Patent: Jan. 14, 2025

(54) SPLICED PANEL

(71) Applicant: TCL CHINA STAR OPTOELECTRONICS TECHNOLOGY CO., LTD., Guangdong (CN)

(72) Inventors: Jun Zhao, Guangdong (CN); Juncheng Xiao, Guangdong (CN); Daobing Hu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/617,500

(22) PCT Filed: Nov. 22, 2021

(86) PCT No.: PCT/CN2021/132159
§ 371 (c)(1),
(2) Date: Dec. 8, 2021

(87) PCT Pub. No.: WO2023/082319
PCT Pub. Date: May 19, 2023

(65) Prior Publication Data
US 2024/0006384 A1    Jan. 4, 2024

(30) Foreign Application Priority Data
Nov. 9, 2021   (CN) .......................... 202122723798.0

(51) Int. Cl.
*H01L 25/075*   (2006.01)
*H01L 33/10*   (2010.01)
(Continued)

(52) U.S. Cl.
CPC .......... *H01L 25/0753* (2013.01); *H01L 33/10* (2013.01); *H01L 33/62* (2013.01); *H05K 1/189* (2013.01); *H05K 2201/10128* (2013.01)

(58) Field of Classification Search
CPC ..... H01L 25/0753; H01L 33/10; H01L 33/62; H05K 1/189; H05K 2201/10128; H05K 2201/10106; G02F 1/13336
See application file for complete search history.

(56) References Cited

U.S. PATENT DOCUMENTS

2018/0173036 A1\* 6/2018 Kim ................... G02F 1/133524
2019/0281692 A1\* 9/2019 Jeon ..................... H10K 59/131
(Continued)

FOREIGN PATENT DOCUMENTS

CN    104062795 A    9/2014
CN    104464557 A    3/2015
(Continued)

OTHER PUBLICATIONS

International Search Report in International application No. PCT/CN2021/132159, mailed on Jul. 29, 2022.
(Continued)

*Primary Examiner* — Kyoung Lee
*Assistant Examiner* — Christina A Sylvia
(74) *Attorney, Agent, or Firm* — PV IP PC; Wei Te Chung

(57) ABSTRACT

A spliced panel is provided. A light-emitting diode substrate is disposed on two adjacent display panels and blocks a gap. A substrate comprises a first surface, a second surface, and a third surface. The first surface and the second surface are disposed opposite to each other. The third surface is connected between the first surface and the second surface. A plurality of light-emitting diodes are disposed on the first surface. The reflective layer is disposed on the third surface.

(Continued)

An angle between the third surface and the second surface is greater than or equal to 90°.

17 Claims, 3 Drawing Sheets

(51) Int. Cl.
*H01L 33/62* (2010.01)
*H05K 1/18* (2006.01)

(56) References Cited

U.S. PATENT DOCUMENTS

2024/0027812 A1* 1/2024 Zhao ................... H01L 25/0753
2024/0036374 A1* 2/2024 Xiao ................. G02F 1/136209

FOREIGN PATENT DOCUMENTS

| | | |
|---|---|---|
| CN | 207009016 U | 2/2018 |
| CN | 207353253 U | 5/2018 |
| CN | 108205970 A | 6/2018 |
| CN | 108230914 A | 6/2018 |
| CN | 111208673 A | 5/2020 |
| CN | 111290154 A | 6/2020 |
| CN | 212461009 U | 2/2021 |
| JP | 2005017614 A | 1/2005 |

OTHER PUBLICATIONS

Written Opinion of the International Search Authority in International application No. PCT/CN2021/132159, mailed on Jul. 29, 2022.

* cited by examiner

SPLICED PANEL

FIELD

The present disclosure relates to the field of display technologies, and more specifically, to a spliced panel.

BACKGROUND

During processes of researching and applying conventional technologies, the inventor of the present disclosure found that a large scale and high resolution have become a development trend of outdoor displays with rapid development of outdoor display market. Conventional liquid crystal display (LCD) panels not only have low cost but also have high resolution. However, the conventional LCD panels are spliced panels which inevitably have a gap that affects a visual experience. Mini light-emitting diode (mini-LED) panels and micro light-emitting diode (micro-LED) panels are still immature in terms of small gaps. Also, compared with LCDs, the mini-LEDs and the micro-LEDs have low resolution and high cost. Therefore, it is critical to solve a gap issue of spliced LCD panels.

SUMMARY

An embodiment of the present disclosure provides a spliced panel which can eliminate a gap existing in a display image.

The present disclosure provides a spliced panel, comprising:
  at least two display panels, wherein the at least two display panels are spliced with each other, and a gap is defined between two adjacent display panels; and
  a light-emitting diode substrate, wherein the light-emitting diode substrate is disposed on two adjacent display panels and blocks the gap, the light-emitting diode substrate comprises a substrate, a plurality of light-emitting diodes, and a reflective layer, the substrate comprises a first surface, a second surface, and a third surface, the first surface is disposed opposite to the second surface, the first surface is defined on a side of the display panels away from the substrate, and the third surface is connected between the first surface and the second surface; and
  wherein the light-emitting diodes are disposed on the first surface, the reflective layer is disposed on the third surface, an angle between the third surface and the second surface is greater than or equal to 90°;
  the angle between the third surface and the second surface is greater than 90°; and
  a scattering layer is disposed on a surface of the reflective layer.

Optionally, in some embodiments of the present disclosure, the scattering layer comprises a plurality of protrusion structures arranged in an array manner.

Optionally, in some embodiments of the present disclosure, the scattering layer comprises a base body and a plurality of scattering particles disposed in the base body, thereby scattering light.

Optionally, in some embodiments of the present disclosure, the light-emitting diode substrate comprises a plurality of wires and a plurality of conductive pads. A plurality of vias are defined on the substrate, the wires are disposed on the first surface, the conductive pads are disposed on the second surface, the wires are electrically connected to the conductive pads by the vias, and the light-emitting diodes are connected to the wires.

Optionally, in some embodiments of the present disclosure, the spliced panel comprises a flexible circuit board, the flexible circuit board is bondedly connected to the conductive pads, the flexible circuit board is disposed in the gap and is bent to a backside of the display panels.

Optionally, in some embodiments of the present disclosure, the conductive pads are parallelly disposed and correspond to the gap, and the flexible circuit board is bondedly connected to the conductive pads.

Optionally, in some embodiments of the present disclosure, each of the display panels comprises a first substrate, a second substrate, and a plurality of liquid crystals disposed between the first substrate and the second substrate, and the first substrate comprises a base plate and a black matrix layer disposed on the base plate; and
  each of the display panels comprises a display area and a non-display area defined around the display area, the black matrix layer is partially disposed in the non-display area, and the light-emitting diode substrate is correspondingly disposed in the non-display area.

Optionally, in some embodiments of the present disclosure, the light-emitting diode substrate is provided with a first area and a second area defined on two sides of the first area; and
  brightness of the light-emitting diodes in the first area, brightness of the light-emitting diodes in the second area, and brightness of the display panels are sequentially decreased.

The present disclosure further relates to a spliced panel, comprising:
  at least two display panels, wherein the at least two display panels are spliced with each other, and a gap is defined between two adjacent display panels; and
  a light-emitting diode substrate, wherein the light-emitting diode substrate is disposed on two adjacent display panels and blocks the gap, the light-emitting diode substrate comprises a substrate, a plurality of light-emitting diodes, and a reflective layer, the substrate comprises a first surface, a second surface, and a third surface, the first surface is disposed opposite to the second surface, the first surface is defined on a side of the display panels away from the substrate, and the third surface is connected between the first surface and the second surface; and
  wherein the light-emitting diodes are disposed on the first surface, the reflective layer is disposed on the third surface, an angle between the third surface and the second surface is greater than or equal to 90°.

Optionally, in some embodiments of the present disclosure, the angle between the third surface and the second surface is greater than 90°.

In the spliced panel provided by the present disclosure, the light-emitting diode substrate is disposed on the gap, thereby eliminating a gap existing in a display image. In addition, the reflective layer is disposed on the third surface. Therefore, part of light emitted from the display panels is reflected outside the display panel, thereby preventing dark lines from being viewed by users due to a lateral side of the light-emitting diode substrate not emitting light.

Optionally, in some embodiments of the present disclosure, a scattering layer is disposed on a surface of the reflective layer. Therefore, light is scattered and is reflected evenly.

Optionally, in some embodiments of the present disclosure, the scattering layer comprises a plurality of protrusion structures arranged in an array manner, thereby scattering light.

Optionally, in some embodiments of the present disclosure, the scattering layer comprises a base body and a plurality of scattering particles disposed in the base body, thereby scattering light.

Optionally, in some embodiments of the present disclosure, the light-emitting diode substrate comprises a plurality of wires and a plurality of conductive pads. A plurality of vias are defined on the substrate, the wires are disposed on the first surface, the conductive pads are disposed on the second surface, the wires are electrically connected to the conductive pads by the vias, and the light-emitting diodes are connected to the wires.

Wherein, the conductive pads can be disposed on the second surface because of the through-holes. That is, the conductive pads are bonded to a backside of the light-emitting diode substrate.

Optionally, in some embodiments of the present disclosure, the spliced panel comprises a flexible circuit board, the flexible circuit board is bondedly connected to the conductive pads, the flexible circuit board is disposed in the gap and is bent to a backside of the display panels, thereby bonding the light-emitting substrate to the flexible circuit board.

Optionally, in some embodiments of the present disclosure, the conductive pads are parallelly disposed and correspond to the gap, and the flexible circuit board is bondedly connected to the conductive pads, thereby saving bonding space.

Optionally, in some embodiments of the present disclosure, each of the display panels comprises a first substrate, a second substrate, and a plurality of liquid crystals disposed between the first substrate and the second substrate, and the first substrate comprises a base plate and a black matrix layer disposed on the base plate; and each of the display panels comprises a display area and a non-display area defined around the display area, the black matrix layer is partially disposed in the non-display area, and the light-emitting diode substrate is correspondingly disposed in the non-display area.

Wherein, the black matrix layer is disposed in the non-display area to be a background of the light-emitting diode substrate. As such, a contrast ratio of an image displayed by the light-emitting diode substrate is increased.

Optionally, in some embodiments of the present disclosure, the light-emitting diode substrate is provided with a first area and a second area defined on two sides of the first area; and brightness of the light-emitting diodes in the first area, brightness of the light-emitting diodes in the second area, and brightness of the display panels are sequentially decreased.

Because of this arrangement, brightness of the light-emitting diode substrate can be prevented to be too high. Therefore, an entire image displayed by the spliced panel is gradient, thereby improving a display effect.

Optionally, in some embodiments of the present disclosure, resolution of the light-emitting diode substrate and resolution of the display panels are equal, thereby improving a display effect of the spliced panel.

Regarding the beneficial effects: in a spliced panel provided by an embodiment of the present disclosure, a light-emitting diode substrate is disposed on two adjacent display panels and blocks a gap. A substrate comprises a first surface, a second surface, and a third surface. The first surface and the second surface are disposed opposite to each other. The first surface is defined on a side of the substrate away from the display panels. The third surface is defined between the first surface and the second surface. A plurality of light-emitting diodes are disposed on the first surface. The reflective layer is disposed on the third surface. An angle between the third surface and the second surface is greater than or equal to 90°. Wherein, in the spliced panel provided by the present disclosure, the light-emitting diode substrate is disposed on the gap, thereby eliminating a gap existing in a display image. In addition, the reflective layer is disposed on the third surface. Therefore, part of light emitted from the display panels is reflected outside the display panels, thereby preventing dark lines from being viewed by users due to a lateral side of the light-emitting diode substrate not emitting light.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
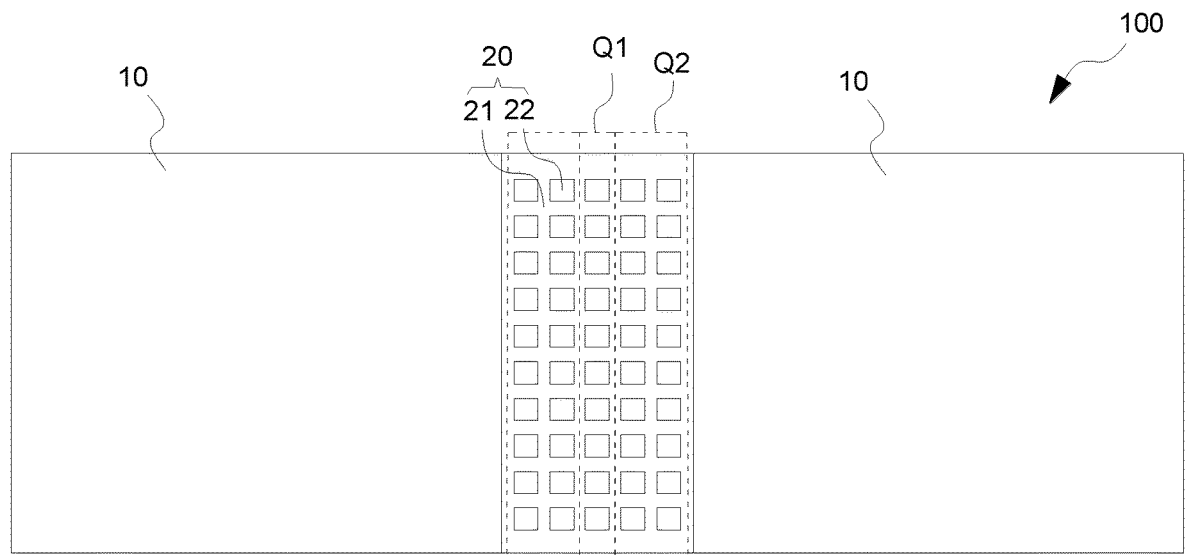
FIG. 1 is a front structural schematic view showing a spliced panel provided by an embodiment of the present disclosure.

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure. In addition, it should be noted that described embodiments are merely used to construct the present disclosure and are not intended to limit the present disclosure. In the present disclosure, unless further description is made, terms such as "top" and "bottom" usually refer to a top of a device and a bottom of a device in an actual process or working status, and specifically, to the orientation as shown in the drawings. Terms such as "inside" and "outside" are based on an outline of a device.

An embodiment of the present disclosure provides a spliced panel which is described below in detail. It should be noted that a description order of the following embodiments does not denote a preferred description order of the embodiments.

Figure 2:
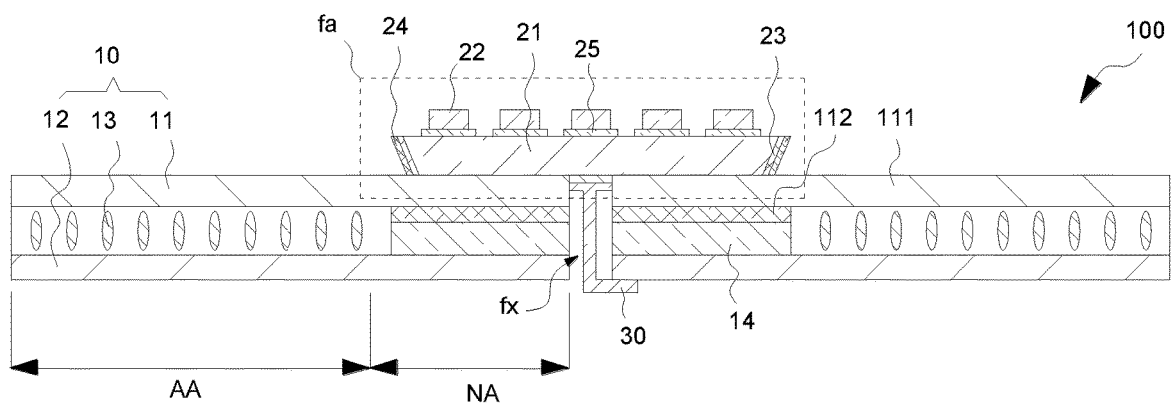
FIG. 2 is a perspective structural schematic view showing the spliced panel provided by the embodiment of the present disclosure.
Figure 3:
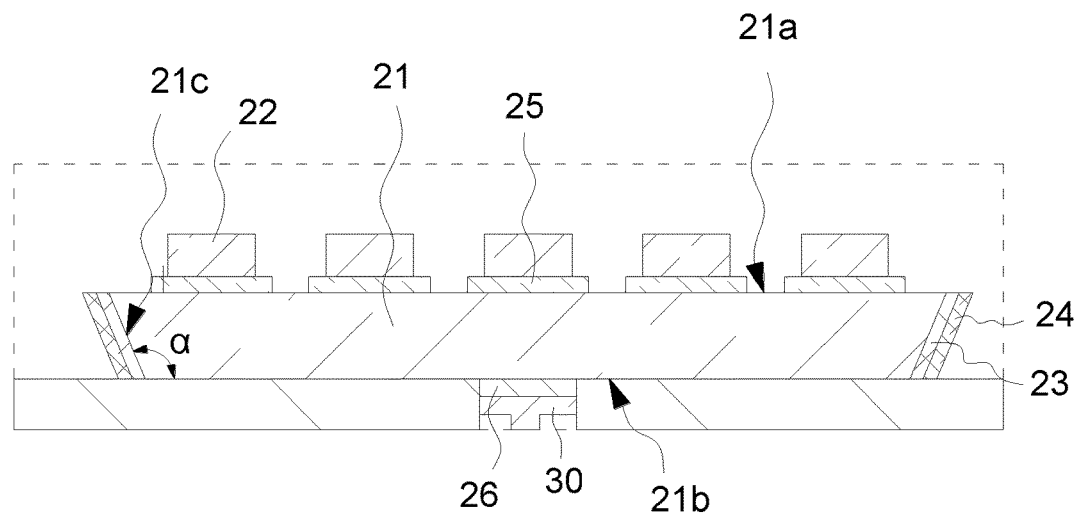
FIG. 3 is an enlarged view of part fa in FIG. 2.

Please refer to FIG. 1, FIG. 2, and FIG. 3, an embodiment of the present disclosure provides a spliced panel 100, including a display panel 10 and a light-emitting diode substrate 20.

At least two display panels 10 are spliced with each other. A gap fx is defined between two adjacent display panels 10. The light-emitting diode substrate 20 is disposed on two adjacent display panels 10 and blocks the gap fx.

The light-emitting diode substrate 20 includes a substrate 21, a plurality of light-emitting diodes 22, and a reflective layer 23. The substrate 21 includes a first surface 21a, a second surface 21b, and a third surface 21c. The first surface 21a and the second surface 21b are disposed opposite to each other. The first surface 21a is defined on a side of the substrate 21 away from the display panels 10. The third surface 21c is connected between the first surface 21a and the second surface 21b.

The light-emitting diodes 22 are disposed on the first surface 21a. The reflective layer 23 is disposed on the third surface 21c. An angle α between the third surface 21c and the second surface is greater than or equal to 90°.

In the spliced panel 100 provided by the present embodiment, the light-emitting diode substrate 20 is disposed on the gap fx, thereby eliminating a gap existing in a display image. In addition, the reflective layer 23 is disposed on the third surface 23c. Therefore, part of light emitted from the display panels 10 is reflected outside the display panels 10 by the reflective layer 23, thereby preventing dark lines from being viewed by users due to a lateral side of the light-emitting diode substrate 20 not emitting light.

It should be noted that the spliced panel 100 of the present embodiment is composed of two display panels 10 spliced with each other, but is not limited thereto. For example, the spliced panel 100 may be composed of four display panels divided into two sets and connected to each other, and four light-emitting diode substrates 20 are disposed on four gaps fx in a one-to-one correspondence.

Optionally, the substrate 21 may be a rigid substrate or a flexible substrate. A material of the substrate 21 includes one of glass, sapphire, silicon, silicon dioxide, polyethylene, polypropylene, polystyrene, polylactic acid, polyethylene terephthalate, polyimide, or polyurethane.

Optionally, the angle α between the third surface 21c and the second surface is greater than 90°. Optionally, the angle α may be 115°, 130°, 145°, 160°, or 175°.

In the present embodiment, the angle α is an obtuse angle, which can not only absorb more light but also increase brightness of light reflected by the reflective layer 23 when the spliced panel 100 is viewed from a lateral side.

Optionally, a scattering layer 24 is further disposed on a surface of the reflective layer 23. Light radiated on the scattering layer 24 is scattered and is reflected outside by the reflective layer 23. Wherein, part of light is reflected on the scattered layer 24 is scattered again and is radiated outside. Because light is scattered by the scattering layer 24, light is reflected outside more evenly.

Figure 4:
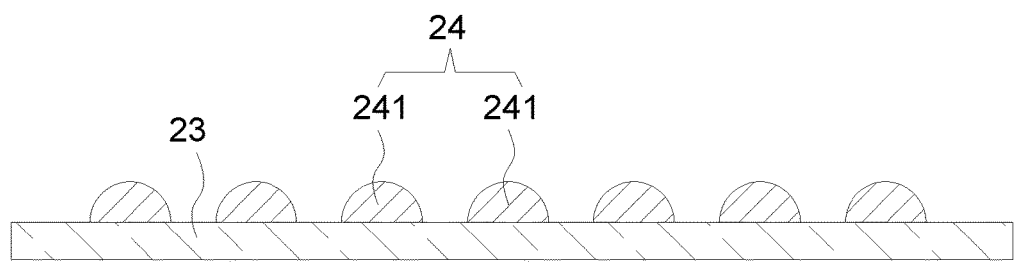
FIG. 4 is a first structural schematic view showing a scattering layer of the spliced panel provided by the embodiment of the present disclosure.

Optionally, please refer to FIG. 4, the scattering layer 24 includes a plurality of protrusion structures 241 arranged in an array manner. The protrusion structures 241 are disposed on the reflective layer 23, thereby scattering light.

Wherein, the protrusion structures 241 may be directly formed on the reflective layer 23. Optionally, the protrusion structures 241 may have a convex hemispherical shape, a convex semi-elliptic shape, or other shapes.

Optionally, the protrusion structures 241 are transparent.

Figure 5:
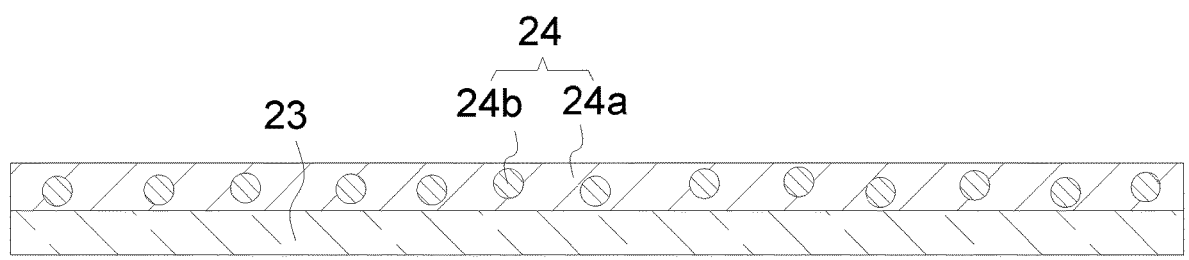
FIG. 5 is a second structural schematic view showing the scattering layer of the spliced panel provided by the embodiment of the present disclosure.

Optionally, please refer to FIG. 5, the scattering layer 24 may have another structure. For example, the scattering layer 24 includes a base body 24a and a plurality of scattering particles 24b disposed in the base body 24a. Wherein, the scattering particles 24b are doped in the base body 24a, thereby scattering light.

Optionally, the scattering particles 24b may have a ball shape or a stick shape. The scattering particles 24b are made of a transparent material.

Optionally, the base body 24a is made of a transparent material.

Figure 6:
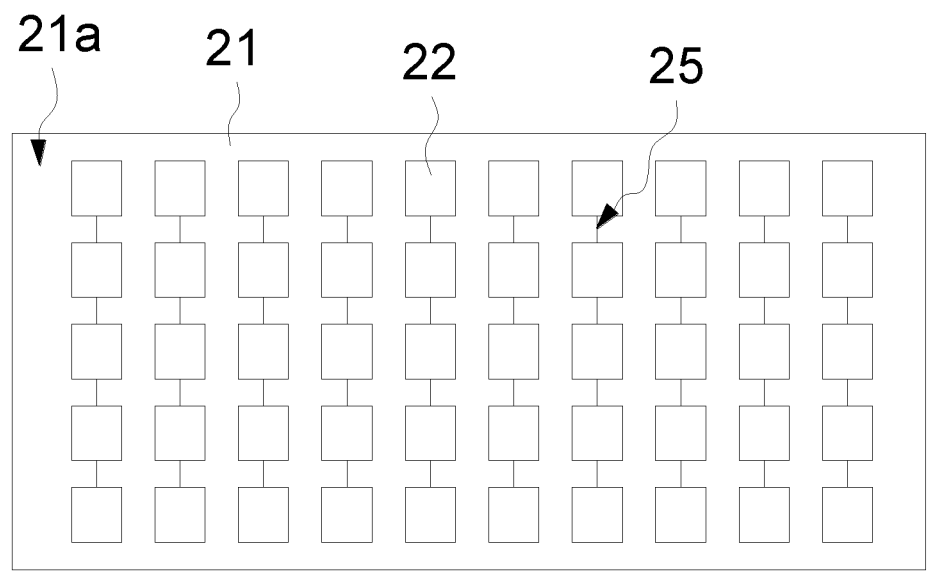
FIG. 6 is a front structural schematic view showing a light-emitting diode substrate of the spliced panel provided by the embodiment of the present disclosure.
Figure 7:
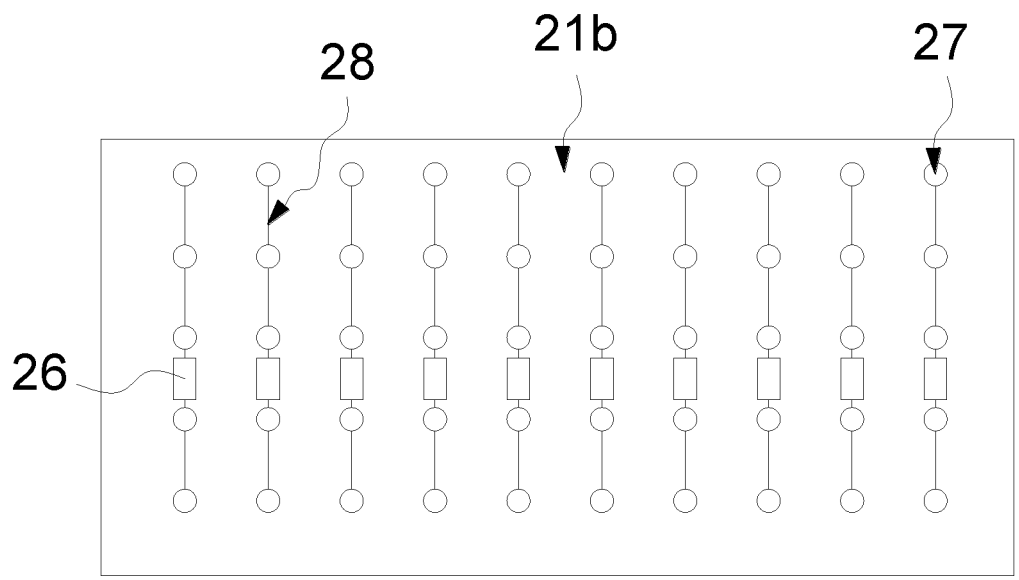
FIG. 7 is a top structural schematic view showing the light-emitting diode substrate of the spliced panel provided by the embodiment of the present disclosure.

Optionally, please refer to FIG. 6 and FIG. 7, the light-emitting diode substrate 20 further includes a plurality of wires 25 and a plurality of conductive pads 26. A plurality of vias 27 are further defined on the substrate 21. The wires 25 are disposed on the first surface 21a. The conductive pads 26 are disposed on the second surface 21b. The wires 25 are electrically connected to the conductive pads 26 by the vias 27. The light-emitting diodes 22 are connected to the wires 25.

In the spliced panel 100 of the present embodiment, the conductive pads 26 are disposed on the second surface 21b, thereby bonding the flexible circuit board 30 to a backside of the light-emitting diode substrate 20. As such, a bonding form of the flexible circuit board 30 and the light-emitting diode substrate 20 is simplified, and space is saved.

Optionally, the light-emitting diode substrate 20 further includes a plurality of guiding lines 28. The guiding lines 28 are disposed on the second surface 21b. The guiding lines 28 are electrically connected to the vias 27 and the conductive pads 26.

Optionally, in the present embodiment, one light-emitting diode 22 is connected to the guiding line 28 by one via 27.

In some embodiments, alternatively, one row or one column of the light-emitting diodes 22 is connected to the guiding line 28 by one via 27.

Optionally, in the present embodiment, the wires 25 are connected between two light-emitting diodes 22. In some embodiments, alternatively, one light-emitting diode 22 is connected to one wire 25, and is connected to the guiding line 28 by one via 27.

Optionally, the spliced panel 100 further includes a flexible circuit board 30. The flexible circuit board 30 is bondedly connected to the conductive pads 26. The flexible circuit board 30 is disposed in the gap fx, and is bent to a backside of the display panels 10.

The conductive pads 26 are parallel disposed and correspond to the gap fx. The flexible circuit board 30 is bondedly connected to the conductive pads 26, thereby saving bonding space.

In the spliced panel 100 of the present embodiment, the flexible circuit board 30 is disposed in the gap fx, thereby further saving space for disposing the flexible circuit board 30.

Optionally, each of the display panels 10 includes a first substrate 11, a second substrate 12, and a plurality of liquid crystals 13. The liquid crystals 13 is disposed between the first substrate 11 and the second substrate 12. The first substrate 11 includes a base plate 111 and a black matrix layer 112 disposed on the base plate 111.

Each of the display panels 10 includes a display area AA and a non-display area NA surrounding the display area AA.

The black matrix layer 112 is partially disposed in the non-display area NA. The light-emitting diode substrate 20 is correspondingly disposed in the non-display area NA.

Wherein, the light-emitting diode substrate 20 is disposed in the non-display area NA, thereby sufficiently utilizing space of the display panels 10. In addition, the black matrix layer 112 is disposed in the non-display area NA to be a background of the light-emitting diode substrate 20, thereby improving a contrast ratio of an image displayed by the light-emitting diode substrate 20.

Each of the display panels 10 further includes a frame sealant 14. The frame sealant 14 is disposed around the liquid crystals 13.

Optionally, please refer to FIG. 1, a first area Q1 and a second area Q2 defined surrounding the first area Q1 are defined on the light-emitting diode substrate 20.

Wherein, brightness of the light-emitting diodes 22 in the first area Q1, brightness of the light-emitting diodes 22 in the second area Q2, and brightness of the display panels 10 are sequentially decreased. This arrangement can prevent light emitted from the light-emitting diode substrate 20 from overly bright. Therefore, an entire image displayed by the spliced panel 100 is gradient, thereby improving a display effect.

Optionally, resolution of the light-emitting diode substrate 20 and resolution of the display panels 10 are equal, thereby improving a display effect of the spliced panel 100.

In a spliced panel provided by an embodiment of the present disclosure, a light-emitting diode substrate is disposed on two adjacent display panels and blocks a gap. A substrate comprises a first surface, a second surface, and a third surface. The first surface and the second surface are disposed opposite to each other. The first surface is defined on a side of the substrate away from the display panels. The third surface is defined between the first surface and the second surface. A plurality of light-emitting diodes are disposed on the first surface. The reflective layer is disposed on the third surface. An angle between the third surface and the second surface is greater than or equal to 90°. Wherein, in the spliced panel provided by the present disclosure, the light-emitting diode substrate is disposed on the gap, thereby eliminating a gap existing in a display image. In addition, the reflective layer is disposed on the third surface. Therefore, part of light emitted from the display panels is reflected outside the display panels, thereby preventing dark lines from being viewed by users due to a lateral side of the light-emitting diode substrate not emitting light.

A spliced panel has been described in detail by the above embodiments, which illustrate principles and implementations thereof. However, the description of the above embodiments is only for helping to understand the technical solution of the present disclosure and core ideas thereof, and it is understood by those skilled in the art that many changes and modifications to the described embodiments can be carried out without departing from the scope and the spirit of the disclosure that is intended to be limited only by the appended claims.

What is claimed is:

1. A spliced panel, comprising:
at least two display panels, wherein the at least two display panels are spliced with each other, and a gap is defined between two adjacent display panels; and
a light-emitting diode substrate, wherein the light-emitting diode substrate is disposed on two adjacent display panels and blocks the gap, the light-emitting diode substrate comprises a substrate, a plurality of light-emitting diodes, and a reflective layer, the substrate comprises a first surface, a second surface, and a third surface, the first surface is disposed opposite to the second surface, the first surface is defined on a side of the display panels away from the substrate, and the third surface is connected between the first surface and the second surface; and
wherein the light-emitting diodes are disposed on the first surface, the reflective layer is disposed on the third surface, an angle between the third surface and the second surface is greater than or equal to 90°; and
a scattering layer is disposed on a surface of the reflective layer.

2. The spliced panel of claim 1, wherein the scattering layer comprises a plurality of protrusion structures arranged in an array manner.

3. The spliced panel of claim 1, wherein the scattering layer comprises a base body and a plurality of scattering particles disposed in the base body.

4. The spliced panel of claim 1, wherein the light-emitting diode substrate comprises a plurality of wires and a plurality of conductive pads, a plurality of vias are defined on the substrate, the plurality of wires are disposed on the first surface, the conductive pads are disposed on the second surface, the plurality of wires are electrically connected to the conductive pads by the plurality of vias, and the light-emitting diodes are connected to the plurality of wires.

5. The spliced panel of claim 4, wherein the spliced panel comprises a flexible circuit board, the flexible circuit board is bonded to the conductive pads, the flexible circuit board is disposed in the gap and is bent to a backside of the display panels.

6. The spliced panel of claim 5, wherein the conductive pads are parallelly disposed and correspond to the gap, and the flexible circuit board is bonded to the conductive pads.

7. The spliced panel of claim 1, wherein each of the display panels comprises a first substrate, a second substrate, and a plurality of liquid crystals disposed between the first substrate and the second substrate, and the first substrate comprises a base plate and a black matrix layer disposed on the base plate; and
each of the display panels comprises a display area and a non-display area defined around the display area, the black matrix layer is partially disposed in the non-display area, and the light-emitting diode substrate is correspondingly disposed in the non-display area.

8. The spliced panel of claim 1, wherein the light-emitting diode substrate is provided with a first area and a second area defined on two sides of the first area; and
brightness of the light-emitting diodes in the first area, brightness of the light-emitting diodes in the second area, and brightness of the display panels are sequentially decreased.

9. A spliced panel, comprising:
at least two display panels, wherein the at least two display panels are spliced with each other, and a gap is defined between two adjacent display panels; and
a light-emitting diode substrate, wherein the light-emitting diode substrate is disposed on two adjacent display panels and blocks the gap, the light-emitting diode substrate comprises a substrate, a plurality of light-emitting diodes, and a reflective layer, the substrate comprises a first surface, a second surface, and a third surface, the first surface is disposed opposite to the second surface, the first surface is defined on a side of the display panels away from the substrate, and the third surface is connected between the first surface and the second surface; and wherein the light-emitting diodes are disposed on the first surface, the reflective layer is disposed on the third surface, an angle between the third surface and the second surface is greater than or equal to 90°.

10. The spliced panel of claim 9, wherein a scattering layer is disposed on a surface of the reflective layer.

11. The spliced panel of claim 10, wherein the scattering layer comprises a plurality of protrusion structures arranged in an array manner.

12. The spliced panel of claim 10, wherein the scattering layer comprises a base body and a plurality of scattering particles disposed in the base body.

13. The spliced panel of claim 9, wherein the light-emitting diode substrate comprises a plurality of wires and a plurality of conductive pads, a plurality of vias are defined on the substrate, the plurality of wires are disposed on the first surface, the conductive pads are disposed on the second surface, the plurality of wires are electrically connected to the conductive pads by the plurality of vias, and the light-emitting diodes are connected to the plurality of wires.

14. The spliced panel of claim 13, wherein the spliced panel comprises a flexible circuit board, the flexible circuit board is bonded to the conductive pads, the flexible circuit board is disposed in the gap and is bent to a backside of the display panels.

15. The spliced panel of claim 14, wherein the conductive pads are parallelly disposed and correspond to the gap, and the flexible circuit board is bonded to the conductive pads.

16. The spliced panel of claim 9, wherein each of the display panels comprises a first substrate, a second substrate, and a plurality of liquid crystals disposed between the first substrate and the second substrate, and the first substrate comprises a base plate and a black matrix layer disposed on the base plate; and each of the display panels comprises a display area and a non-display area defined around the display area, the black matrix layer is partially disposed in the non-display area, and the light-emitting diode substrate is correspondingly disposed in the non-display area.

17. The spliced panel of claim 9, wherein the light-emitting diode substrate is provided with a first area and a second area defined on two sides of the first area; and brightness of the light-emitting diodes in the first area, brightness of the light-emitting diodes in the second area, and brightness of the display panels are sequentially decreased.

* * * * *